United States Patent
Okuno et al.

(10) Patent No.: US 9,214,339 B2
(45) Date of Patent: Dec. 15, 2015

(54) METHOD FOR PRODUCING GROUP III NITRIDE SEMICONDUCTOR

(71) Applicant: TOYODA GOSEI CO., LTD., Kiyosu-shi (JP)

(72) Inventors: Koji Okuno, Kiyosu (JP); Takahide Oshio, Kiyosu (JP); Naoki Shibata, Kiyosu (JP); Hiroshi Amano, Nagoya (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/178,152

(22) Filed: Feb. 11, 2014

(65) Prior Publication Data

US 2014/0227864 A1    Aug. 14, 2014

(30) Foreign Application Priority Data

Feb. 13, 2013  (JP) .................................. 2013-025837

(51) Int. Cl.
*H01L 21/324* (2006.01)
*H01L 21/02* (2006.01)

(52) U.S. Cl.
CPC ........ *H01L 21/0254* (2013.01); *H01L 21/0242* (2013.01); *H01L 21/0262* (2013.01); *H01L 21/02458* (2013.01); *H01L 21/02631* (2013.01)

(58) Field of Classification Search
CPC ..................... H01L 21/0254; H01L 21/02664; H01L 21/02458; H01L 21/823807; H01L 21/823814; H01L 21/02389; H01L 21/105; H01L 33/007; H01L 21/02241; H01L 21/31604; H01L 21/324; H01L 21/76856; H01L 21/823418; H01L 31/03044; H01L 31/03048; H01L 31/1848; H01L 33/32; H01L 21/02631; H01L 21/76829; H01L 31/1856; H01L 33/0066; H01L 33/0075; B81C 2203/0136

See application file for complete search history.

(56) References Cited

U.S. PATENT DOCUMENTS 4,889,583 A * 12/1989  Chen et al. ...................... 117/43
5,064,779 A * 11/1991  Hasegawa ..................... 438/486

(Continued)

FOREIGN PATENT DOCUMENTS

JP    2000-286202 A    10/2000
JP    2002-145700 A     5/2002

(Continued)

OTHER PUBLICATIONS

Japanese Office Action dated Feb. 24, 2015 with a partial English translation thereof.

(Continued)

*Primary Examiner* — Thomas L Dickey
*Assistant Examiner* — Gustavo Ramallo
(74) *Attorney, Agent, or Firm* — McGinn IP Law Group, PLLC.

(57) ABSTRACT

Group III nitride semiconductor having reduced threading dislocation density and uniform Ga-polar surface is provided. Forming a capping layer on a buffer layer containing Al as an essential element at a temperature lower than a temperature at which an oxide of element constituting the buffer layer is formed. Heat treating the substrate having the buffer layer covered by the capping layer at a temperature higher than a temperature at which a crystal of body semiconductor grows without exposing the surface of the buffer layer. The substrate temperature is decreased to a temperature at which a crystal of the body semiconductor grows and the body semiconductor is grown.

20 Claims, 9 Drawing Sheets

(56) References Cited

U.S. PATENT DOCUMENTS

| | | | |
|---|---|---|---|
| 5,990,495 A * | 11/1999 | Ohba | 257/94 |
| 6,007,624 A * | 12/1999 | Wise | 117/96 |
| 6,130,147 A * | 10/2000 | Major et al. | 438/604 |
| 6,177,688 B1 * | 1/2001 | Linthicum et al. | 257/77 |
| 6,232,212 B1 | 5/2001 | Degani et al. | 438/612 |
| 6,255,198 B1 * | 7/2001 | Linthicum et al. | 438/481 |
| 6,437,380 B1 * | 8/2002 | Lim et al. | 257/295 |
| 6,489,221 B2 * | 12/2002 | Gehrke et al. | 438/479 |
| 6,495,709 B1 * | 12/2002 | Celinska et al. | 556/183 |
| 7,692,182 B2 * | 4/2010 | Bergmann et al. | 257/22 |
| 8,882,935 B2 * | 11/2014 | Chakraborty et al. | 148/33.4 |
| 2002/0146855 A1 * | 10/2002 | Goto et al. | 438/29 |
| 2002/0187613 A1 * | 12/2002 | Han et al. | 438/395 |
| 2003/0049898 A1 * | 3/2003 | Karpov et al. | 438/200 |
| 2003/0198874 A1 * | 10/2003 | Lee | 430/5 |
| 2007/0176204 A1 * | 8/2007 | Murata et al. | 257/192 |
| 2009/0186470 A1 * | 7/2009 | Takahashi et al. | 438/522 |
| 2010/0075175 A1 * | 3/2010 | Poblenz et al. | 428/697 |
| 2010/0148223 A1 * | 6/2010 | Jin | 257/255 |
| 2012/0068188 A1 * | 3/2012 | Feigelson et al. | 257/76 |
| 2013/0059407 A1 * | 3/2013 | Miyazaki et al. | 438/37 |
| 2013/0256681 A1 * | 10/2013 | Wang et al. | 257/76 |
| 2013/0256743 A1 * | 10/2013 | Okuno et al. | 257/103 |

FOREIGN PATENT DOCUMENTS

| | | |
|---|---|---|
| JP | 2005-019872 A | 1/2005 |
| JP | 2005-183524 A | 7/2005 |
| JP | 2008-108381 A | 5/2008 |
| JP | 2009-147271 A | 7/2009 |

OTHER PUBLICATIONS

Japanese Office Action dated Aug. 20, 2014 with a partial English translation thereof.

* cited by examiner

GaN on 1020°C annealed AlN

GaN on 1100°C annealed AlN

GaN on 1300°C annealed AlN

GaN on 1400°C annealed AlN

METHOD FOR PRODUCING GROUP III NITRIDE SEMICONDUCTOR

BACKGROUND OF THE INVENTION

1. Field of the Invention

The present invention relates to a method for producing a Group III nitride semiconductor having reduced threading dislocation and good crystallinity.

2. Background Art

Conventionally, a method has been known, in which through Metal Organic Chemical Vapor Deposition (hereinafter referred to as "MOCVD"), a low temperature buffer layer is formed on a sapphire substrate, and GaN is grown on the buffer layer.

For example, in Japanese Patent Application Laid-Open (kokai) No. 2005-19872, after a sapphire substrate is heat-treated at 1,135° C. to clean the surface thereof, with the substrate temperature lowered to 515° C., a GaN buffer layer having a thickness of 20 nm is formed, and with the substrate temperature increased to 1,075° C., fine crystals of GaN are formed on the sapphire substrate. Subsequently, with the substrate temperature maintained at 1,075° C. and the concentration of hydrogen higher than that of nitrogen in the carrier gas, GaN is facet grown using the fine crystals of GaN as nuclei. Then, the substrate temperature is lowered to 1,005° C., and the concentration of nitrogen is made higher than that of hydrogen in the carrier gas to facilitate growth in a lateral direction, and GaN is grown so as to fill gaps among facets. Thus, GaN having reduced threading dislocation density is obtained.

In EXAMPLE 3 of Japanese Patent Application Laid-Open (kokai) No. 2005-183524, after a sapphire substrate is thermally cleaned at 1,200° C., with the substrate temperature at 1,200° C., AlN is epitaxially grown to form a single crystal underlying layer 102 having a thickness of 0.7 µm. Subsequently, with the substrate temperature lowered to 1,150° C., an AlGaN layer 103 is epitaxially grown so as to have a thickness of 100 nm or less, and annealing is performed with the substrate temperature maintained at 1,350° C. for 10 minutes. Then, with the substrate temperature lowered to 1,150° C., an AlGaN layer 104 is further grown. Thus, the threading dislocation density of the AlGaN layer is reduced.

However, in the method of Japanese Patent Application Laid-Open (kokai) No. 2005-19872, after forming a low temperature buffer layer of ultrathin GaN having a thickness of 20 nm at a low temperature, with the temperature increased to a temperature at which GaN can grow, fine crystals of GaN are formed, and then GaN is facet grown. The fine crystals of GaN of the low temperature buffer layer formed at a low temperature are decomposed and evaporated again in the process of temperature increase to the GaN growth temperature. Therefore, after the formation of the low temperature buffer layer, the temperature of the substrate cannot be increased more than a temperature at which GaN can grow. This results in insufficient formation of fine crystal nuclei, and the crystal nuclei cannot grow large. Therefore, the density at the starting point of threading dislocation is still high.

In the method of Japanese Patent Application Laid-Open (kokai) No. 2005-183524, the underlying layer 12 on the base material 11 is epitaxially grown in a thickness of 0.7 µm, and is therefore a single crystal. Moreover, the AlGaN layer 103 is epitaxially grown on the single crystal underlying layer 102, and is therefore a single crystal. Annealing at a stage that the AlGaN layer 103 has been formed facilitates movement of dislocation in the AlGaN layer 103, and thereby reducing the dislocation density (paragraph 0032).

Therefore, Japanese Patent Application Laid-Open (kokai) No. 2005-183524 neither increases the size of the crystal nuclei in the buffer layer in a polycrystal, amorphous or polycrystal/amorphous mixed state, nor inhibits the formation of threading dislocation in the semiconductor layer to be grown.

Japanese Patent Application Laid-Open (kokai) No. 2005-19872 relates to a heat treatment for obtaining the crystal nuclei for facet growth, and does not reduce the density at the starting point of threading dislocation.

The present inventors found for the first time that when GaN is grown after high-temperature heat treatment of AlN buffer layer formed at a low temperature, irregularities or roughness on the surface of GaN become large. They clarified for the first time that the cause of the above problem is that the Al contained in the buffer layer is oxidized by high-temperature heat treatment, and Al oxide is formed, thereby the growth surface of GaN grown on the Al oxide has an N-polarity. N-polar GaN has large surface roughness, and more impurities are incorporated therein. Therefore, it is not suitable for the device. When an oxide is formed, a new crystal defect (dislocation or deposition defect) is more likely to occur on the oxide, which reduces the crystal quality of the semiconductor to be grown.

SUMMARY OF THE INVENTION

In view of the foregoing, an object of the present invention is to uniform and reduce the threading dislocation density of the semiconductor to be grown by reducing the density at the starting point of threading dislocation. Other object is to obtain a Group III nitride semiconductor with less N-polar surface mixed and having a uniform Ga-polar surface as a growth surface.

In a first aspect of the present invention, there is provided a method for growing a Group III nitride semiconductor on a substrate of a material different from the Group III nitride semiconductor, the method comprising:

forming a buffer layer of AlN or $Al_xIn_yGa_{1-x-y}N$ ($0<x<1$, $0≤y<1$, $0<x+y≤1$) containing Al as an essential element, in a polycrystal, amorphous or polycrystal/amorphous mixed state, on the substrate;

forming a capping layer of GaN, $In_uGa_{1-u}N$ ($0<u≤1$), or $Al_vIn_wGa_{1-v-w}N$ ($0<v<1$, $0≤w<1$, $0<v+w≤1$) having a lower Al composition ratio than 1/2 of that of the buffer layer, on the buffer layer at a lower temperature than a temperature at which an oxides of element constituting the buffer layer is formed;

heat-treating the substrate having the buffer layer covered by the capping layer at a higher temperature than that at which a crystal of body semiconductor comprising Group III nitride semiconductor grows, without exposing the surface of the buffer layer; and after the heat treatment, lowering the substrate temperature to a temperature at which a crystal of body semiconductor grows, and growing a body semiconductor on the buffer layer covered by the capping layer or the exposed buffer layer.

The buffer layer comprises AlN or $Al_xIn_yGa_{1-x-y}N$ ($0<x<1$, $0≤y<1$, $0<x+y≤1$) containing Al as an essential element. However, the Al composition ratio x is preferably 0.3 or more, and more preferably, 0.5 or more. The present invention is characterized in that the heat treatment is performed with oxidation of the elements constituting the buffer layer prevented. Moreover, Al constituting the buffer layer is easy to be oxidized. The larger the amount of Al contained in the buffer layer, the larger the significance of the capping layer for preventing oxidation. Therefore, the Al composition ratio of the buffer layer is preferably 0.3 or more or 0.5 or more.

The capping layer is a layer for preventing oxidation of Al or other constituent elements contained in the buffer layer in heat treatment. Therefore, when the capping layer comprises $Al_vIn_wGa_{1-v-w}N$ ($0<v<1$, $0\leq w<1$, $0<v+w\leq 1$) being Group III nitride semiconductor containing Al, the Al oxide amount of the capping layer must be smaller than that of the buffer layer when no capping layer is formed to make the presence of the capping layer significant. That is why the Al composition ratio of the capping layer is 1/2 or less than that of the buffer layer. However, the lower the Al composition ratio of the capping layer, the more preferable it is. When the Al composition ratio of the capping layer is 1/5 or less than that of the buffer layer, Al oxidation of the capping layer does not cause a problem. The capping layer preferably does not contain Al which is easy to be oxidized, and most preferably is formed of GaN. The capping layer preferably covers the buffer layer at least during heat treatment. The capping layer may thinly cover the surface of the buffer layer in such a thickness that does not inhibit the effect of the buffer layer when growing the body semiconductor. Alternatively the capping layer may disappear to expose the buffer layer just before growing the body semiconductor, if the buffer layer is not oxidized by that the body semiconductor immediately grows thereon.

In the present invention, oxides of the elements constituting the buffer layer include In or Ga oxide. However, Al oxide is most likely to be formed.

Moreover, in the present invention, the heat treatment is preferably a process to reduce the crystal nucleus density of the buffer layer compared to that before the heat treatment. Here, "crystal nuclei" refer to islands or grains, which act as the growth starting point of body semiconductor layer to be grown. One nucleus preferably has no defect, but sometimes contains a defect (such as dislocation or deposition defect) acting as the starting point of a defect (such as dislocation or deposition defect) of body semiconductor to be grown. The defect contained in the crystal nucleus is considered to be disappeared, moved, and reduced during heat treatment.

In the present invention, the capping layer preferably has such a thickness so as not to completely evaporate and disappear in heat treatment, and not to expose the buffer layer. More specifically, the thickness of the capping layer is preferably from 1 nm to 500 nm. When the thickness falls within this range, the capping layer is prevented from completely evaporating and disappearing in the process of heat treatment, and Al or other elements of the buffer layer are prevented from being oxidized.

Moreover, the capping layer is preferably formed at a temperature lower than that at which the capping layer is decomposed. Even at a temperature in which the constituent elements such as Al of the buffer layer are not oxidized, the capping layer must be efficiently formed on the buffer layer.

The oxygen source for forming oxides of the elements constituting the buffer layer is oxygen or moisture remained in the growth furnace, and oxygen or moisture contained in the raw material gas such as $NH_3$. Moreover, when the substrate comprises oxide, oxygen dispersed in the growth furnace due to decomposition of the substrate is seemed to be oxygen source.

Therefore, when the substrate comprises oxide such as sapphire, ZnO, spinel, or $Ga_2O_3$, the capping layer is preferably formed at the temperature lower than the temperature at which oxygen is released from the oxide. It is known that oxygen is released by heating sapphire, ZnO, spinel, or $Ga_2O_3$. Therefore, before oxygen is released from the back surface of the substrate comprising oxide such as sapphire, ZnO, spinel, or $Ga_2O_3$, the capping layer must be formed on the buffer layer.

That is, in the present invention, a capping layer is formed on a buffer layer before oxidation of the elements constituting the buffer layer such as Al.

The formation temperature of the capping layer is preferably equal to or lower than a temperature at which a single crystal of body semiconductor grows. The heat treatment temperature is preferably equal to or higher than a temperature at which the capping layer or the body semiconductor does not grow, a decomposition temperature or a sublimation temperature. The heat treatment temperature is preferably 1,150° C. or more. When the temperature falls within this range, the temperature is higher than the growth temperature of a single crystal Group III nitride semiconductor being body semiconductor, and the semiconductor does not grow at all. The temperature is preferably from 1,150° C. to 1,700° C. When the temperature exceeds 1,700° C., sapphire substrate is damaged, which is not preferable. The heat treatment temperature may be from 1,300° C. to 1,500° C. Further, the heat treatment temperature may be from 1,200° C. to 1,400° C. The most preferable range of heat treatment temperature is between 1,150° C. and 1,400° C., The buffer layer may be formed by sputtering, molecular beam epitaxy (MBE), pulse laser deposition (PLD), or MOCVD. When the buffer layer is formed by MOCVD, the substrate temperature is preferably from 300° C. to 600° C. The thickness of the buffer layer is preferably from 1 nm to 100 nm. When AlN or $Al_xIn_yGa_{1-x-y}N$ ($0<x<1$, $0\leq y<1$, $0<x+y\leq 1$) containing Al as an essential element is deposited in a thickness of the above range at a formation temperature of 300° C. to 600° C., it is in a polycrystal, amorphous or polycrystal/amorphous mixed state. This state is a low temperature formed buffer layer for epitaxially growing a Group III nitride semiconductor on a substrate of a material different from the Group III nitride semiconductor.

The heat treatment is preferably performed under a stream of gas including ammonia gas or nitrogen compound gas. When the buffer layer covered by the capping layer is heated at 1,150° C. or more in this state, adjacent crystal grains coalesce with each other by solid-phase growth to form larger crystal grains. That is, the buffer layer becomes an aggregate of crystal nuclei of larger single crystals. At the same time, defects possibly contained in one crystal nucleus move or disappear, and the defect density is reduced. A Group III nitride semiconductor epitaxially grows on the buffer layer satisfying with a condition that the lattice constant of the growing semiconductor matches with that of the crystal nucleus. Since the growing semiconductors coalesce in a grain boundary of a crystal nucleus, threading dislocation easily occurs in the grain boundary. However, since the crystal nucleus is large, the density at the starting point of threading dislocation is reduced. Thereby, the threading dislocation density in the growing semiconductor layer can be originally reduced.

The buffer layer is prevented from being oxidized in heat treatment because it is covered by the capping layer before Al oxide or constituent element oxide is formed. As a result, a Group III nitride semiconductor is prevented from growing in the orientation of an N-polar in the growth of body semiconductor, and a single crystal Group III nitride semiconductor is uniformly grown with a Ga-polar surface.

The present invention is particularly effective when +c plane (Ga-polar surface) is a crystal growth surface in the growth of the body semiconductor because it can prevent the inversion to N-polar surface. However, when an oxide of the element constituting the buffer layer is formed, a new crystal defect (dislocation or deposition defect) occurs with the oxide as the starting point. Therefore, in the present invention, it is also effective in the growth of the body semiconductor in a direction other than the +c axis direction, in which the polarity is not inverted or polarity inversion does not cause a problem. A non-polar a-plane Group III nitride semiconductor and a non-polar m-plane Group III nitride semiconductor are grown on a r-plane sapphire substrate and a m-plane sapphire substrate, respectively. When the growth surface of the sapphire substrate is a surface inclined at angle to a low index plane, a Group III nitride semiconductor is grown with the non-polar plane, semi-polar plane as the growth surface. In these cases, even if an oxide of the element constituting the buffer layer is formed, polarity inversion does not cause a problem. Even in such case, the dislocation density of the body semiconductor can be reduced by forming the capping layer on the buffer layer and performing the heat treatment.

No particular limitation is imposed on the material of the substrate so long as a Group III nitride semiconductor can grow thereon. The substrate may be formed of, for example, sapphire, SiC, Si, ZnO, spinel or $Ga_2O_3$. The Group III nitride semiconductor being body semiconductor may be, for example, quaternary AlGaInN, a ternary AlGaN or InGaN, and a binary GaN, each having any composition ratio but Ga as an essential element. In these semiconductors, a part of Al, Ga, or In may be substituted by another Group 13 (Group IIIB) element (i.e., B or Tl), or a part of N may be substituted by another Group 15 (Group VB) element (i.e., P, As, Sb, or Bi). An n-type impurity or p-type impurity may be added. Generally, Si is used as an n-type impurity, and Mg is used as a p-type impurity.

According to the present invention, a buffer layer is formed in a polycrystal, amorphous or polycrystal/amorphous mixed state by depositing AlN or $Al_xIn_yGa_{1-x-y}N$ ($0<x<1$, $0\leq y<1$, $0<x+y\leq1$) containing Al as an essential element on a substrate, a capping layer of GaN, $In_uGa_{1-u}N$ ($0<u\leq1$), or $Al_vIn_wGa_{1-v-w}N$ ($0<v<1$, $0\leq w<1$, $0<v+w\leq1$) having a lower Al composition ratio than 1/2 of that of the buffer layer is formed on the buffer layer at a lower temperature than that at which oxides of the elements constituting the buffer layer are formed, and thereafter heat treatment is performed at a higher temperature than that at which a single crystal Group III nitride semiconductor being body semiconductor grows, thereby reducing the crystal nucleus density of the buffer layer compared to before the heat treatment.

The crystal nuclei, to which Group III nitride semiconductor as the target of crystal grows in a lattice-match, become large, thereby the grain boundary density is reduced. Thus, the density is reduced at the starting point of threading dislocation. As a result, the threading dislocation density can be primitively reduced in the obtained semiconductor. In the heat treatment, the constituent elements such as Al of the buffer layer are not oxidized because the buffer layer is covered by the capping layer. Therefore, the growth surface of the body semiconductor grown on the buffer layer is not inverted to N-polarity, and a single crystal Group III nitride semiconductor having an uniform Ga-polar surface can be obtained. Moreover, even when the body semiconductor is grown in a semi-polar axis and non-polar axis direction where the polarity is not inverted or polarity inversion does not cause a problem, the dislocation density of the body semiconductor can be reduced according to the present invention.

Thus, the Group III nitride semiconductor having a flat surface and appropriate for producing a device can be obtained.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

The present Embodiment is an example in which an AlN buffer layer was formed by MOCVD on a sapphire substrate having a c-plane main surface, and after heat treatment, GaN was grown thereon. The crystal growth method is a Metal Organic Chemical Vapor Deposition (MOCVD). The gases employed in MOCVD are as follows: hydrogen ($H_2$) and nitrogen ($N_2$) as a carrier gas; ammonia gas ($NH_3$) as a nitrogen source; trimethylgallium ($Ga(CH_3)_3$, hereinafter referred to as "TMG") as a Ga source; and trimethylaluminum (Al(CH₃)₃, hereinafter referred to as "TMA") as an Al source.

Figure 1:
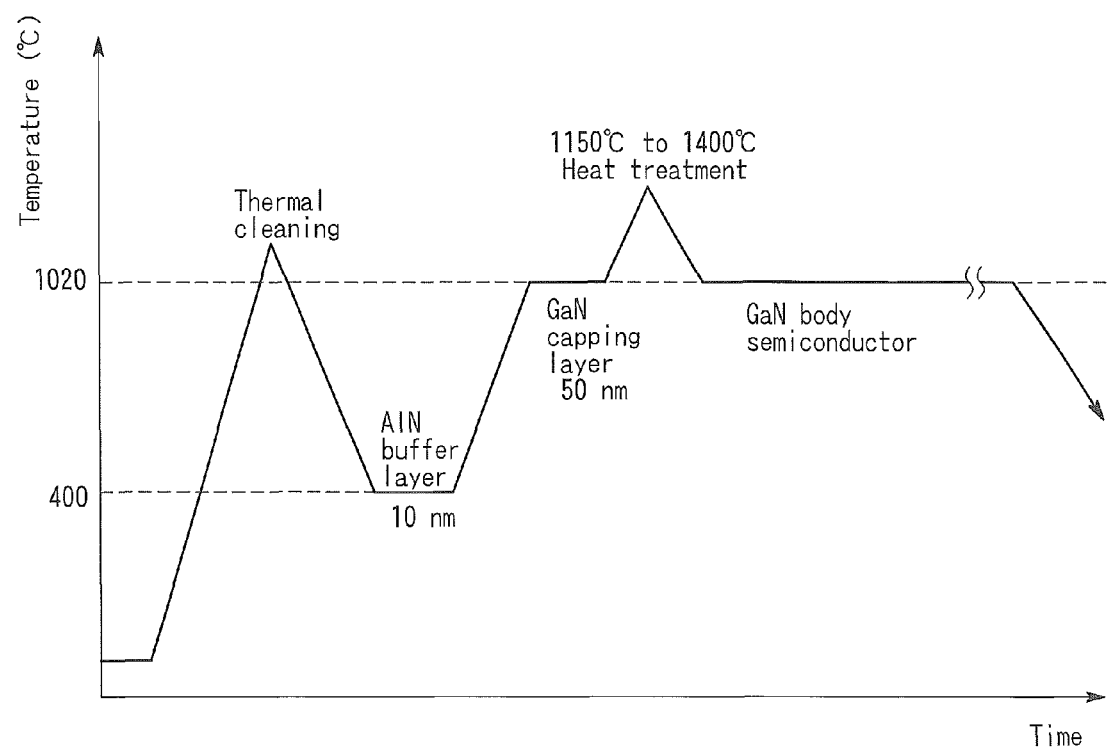
FIG. 1 is a characteristic diagram showing the relationship between the substrate temperature changes during growth and the type of semiconductor deposited by the production method according to the Embodiment of the present invention.

Firstly, change of crystal nucleus by heat treatment of a buffer layer will be described. FIG. 1 shows time change of control temperature of a sapphire substrate during semiconductor growth. A sapphire substrate was placed in a MOCVD apparatus, the substrate temperature was increased from room temperature to 1,180° C. under a stream of hydrogen gas, and thermal cleaning was performed to remove deposits from the surface of the sapphire substrate. Thereafter, the substrate temperature was lowered to 400° C. under a stream of TMA and ammonia gas together with hydrogen gas, and a buffer layer of AlN having a thickness of 10 nm was formed on the sapphire substrate by MOCVD. Then, the supply of TMA was stopped, the substrate temperature was increased to 1,020° C. under a stream of TMG and ammonia gas as raw material gases, and hydrogen gas as a carrier gas, and maintained for two minutes with keeping the gas flow rate and a capping layer of GaN having a thickness of 50 nm was formed. Subsequently, the supply of TMG was stopped, the substrate temperature was increased to a heat treatment temperature of 1,300° C. under a stream of ammonia gas and hydrogen gas as a carrier gas and maintained for ten seconds with keeping the flow rate, and the buffer layer was heat-treated. During this heat treatment, the capping layer is not completely evaporated, and the surface of the buffer layer is not exposed. At the temperature of 1,020° C., the capping layer is formed but Al oxide is not formed. At the heat treatment temperature of 1,300° C., Al oxide is formed.

After the AlN buffer layer covered by the GaN capping layer was heat-treated at a heat treatment temperature of 1,300° C. which is higher than 1,150° C., the substrate temperature was lowered from 1,300° C. to 1,020° C. under a stream of hydrogen gas as a carrier gas, together with TMG and ammonia gas as raw material gases, and a GaN (body semiconductor) having a thickness of 1.5 μm was formed with no impurities doped. The crystal nucleus density of the buffer layer is reduced, resulting in reduction of the density at the starting point of threading dislocation. Therefore, the threading dislocation density in GaN grown on the buffer layer is reduced.

Figure 2:
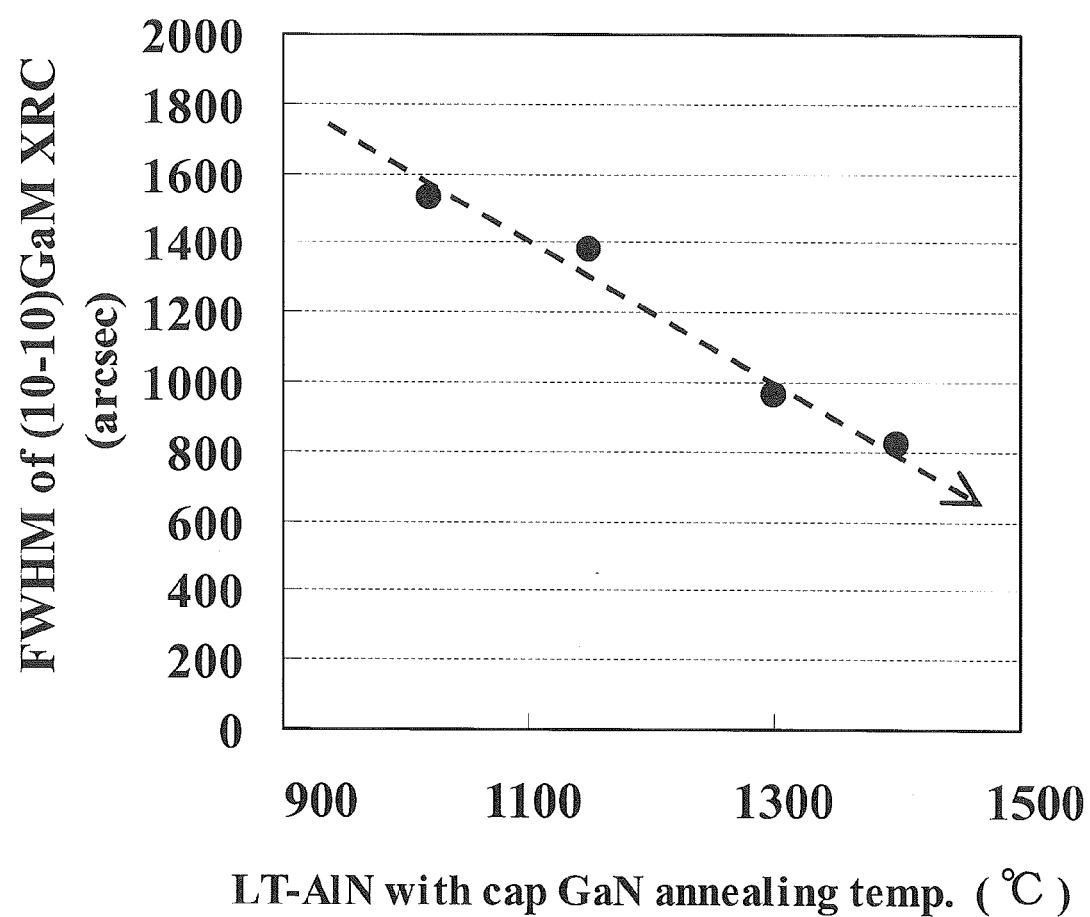
FIG. 2 is a characteristic diagram showing the relationship between the heat treatment temperature of the buffer layer and the crystallinity (FWHM) of GaN grown by the production method according to the Embodiment of the present invention.

A relationship between the heat treatment temperature of the buffer layer covered by the capping layer and the x-ray rocking curve full width at half maximum (FWHM) of a GaN (10-10) plane of the body semiconductor were measured. FIG. 2 shows the measurement results. When the heat treatment temperature is 1,020° C., the FWMH is 1,540 seconds. When the heat treatment temperature is 1,150° C., the FWMH is 1,400 seconds. When the heat treatment temperature is 1,300° C., the FWMH is 960 seconds. When the heat treatment temperature is 1,400° C., the FWMH is 830 seconds. That is, it is found that the single crystallinity is improved in proportion to the increase of the heat treatment temperature.

Figure 3:
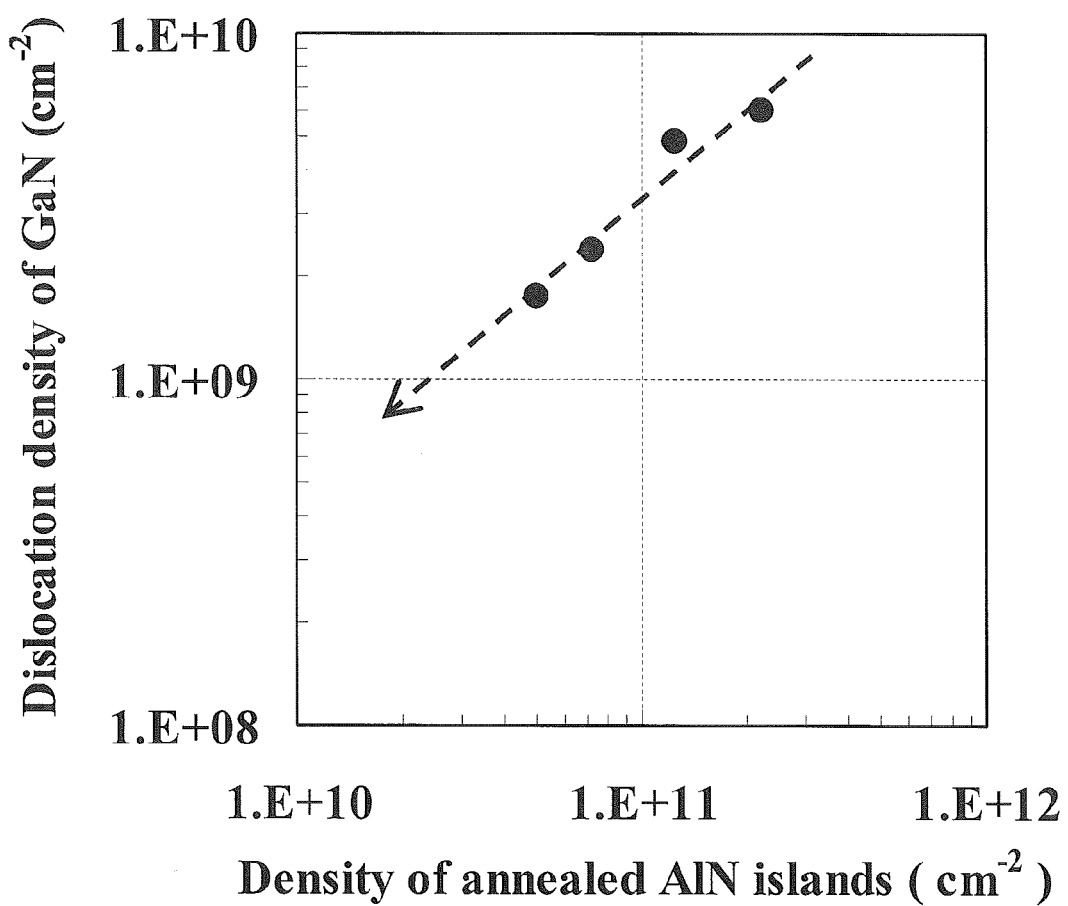
FIG. 3 is a characteristic diagram showing the relationship between the crystal nucleus density of the buffer layer and the dislocation density of GaN grown by the production method according to the Embodiment of the present invention.
Figure 4A:
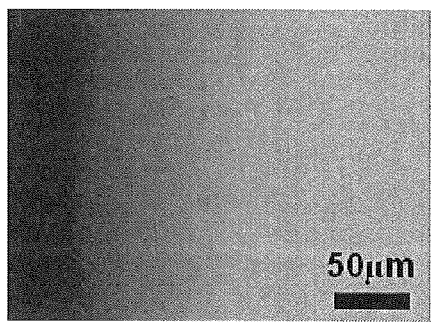
FIGS. 4A to 4D are optical photomicrographs showing the surface conditions of GaN grown on the buffer layers heat-treated at each heat treatment temperature by the production method according to the Embodiment of the present invention.
Figure 4B:
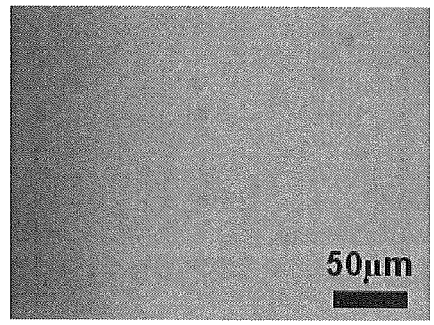
Figure 4C:
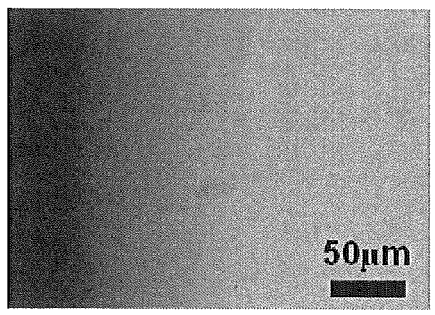
Figure 4D:
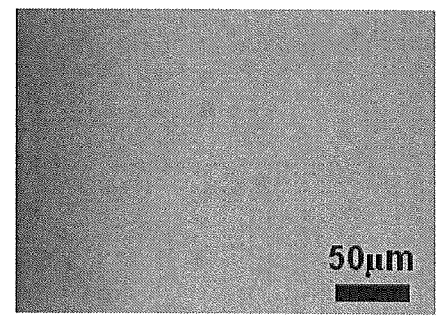

The relationship between the crystal nucleus density of the buffer layer after heat treatment and the threading dislocation density of GaN grown on the buffer layer covered by the capping layer was measured. The threading dislocation density was obtained by measuring the X-ray rocking curve FWHM (full width at half maximum) and using a formula: Dislocation density =FWHM value/(9b²). Here, b is Burger's vector. FIG. 3 shows the measurement results. When the crystal nucleus density of the buffer layer is 2.2×10¹¹/cm², the dislocation density of GaN is 6.0×10⁹/cm². When the crystal nucleus density of the buffer layer is 1.2×10¹¹/cm², the dislocation density of GaN is 5.0×10⁹/cm². When the crystal nucleus density of the buffer layer is 7.5×10¹⁰/cm², the dislocation density of GaN is 2.3×10⁹/cm². When the crystal nucleus density of the buffer layer is 4.8×10¹⁰/cm², the dislocation density of GaN is 1.8×10⁹/cm². It is found that the dislocation density of GaN is decreased in proportion to the decrease of the crystal nucleus density of the buffer layer.

The relationship between the heat treatment temperature of the buffer layer and the surface condition of GaN was measured. FIGS. 4A to 4D are optical photomicrographs of the surfaces of GaN grown after the buffer layer covered by the capping layer was heat-treated at each temperature. At all heat treatment temperatures, heat treatment is performed with the buffer layer covered by the capping layer. It is understood that the surface morphology of GaN is good. The investigation of etching resistance of GaN to KOH solution revealed that GaN was not etched by KOH. Therefore, it is found that the growth surface of GaN is uniformly a Ga-polar surface. That is, polarity inversion to the N-polar surface is not observed.

Figure 5:
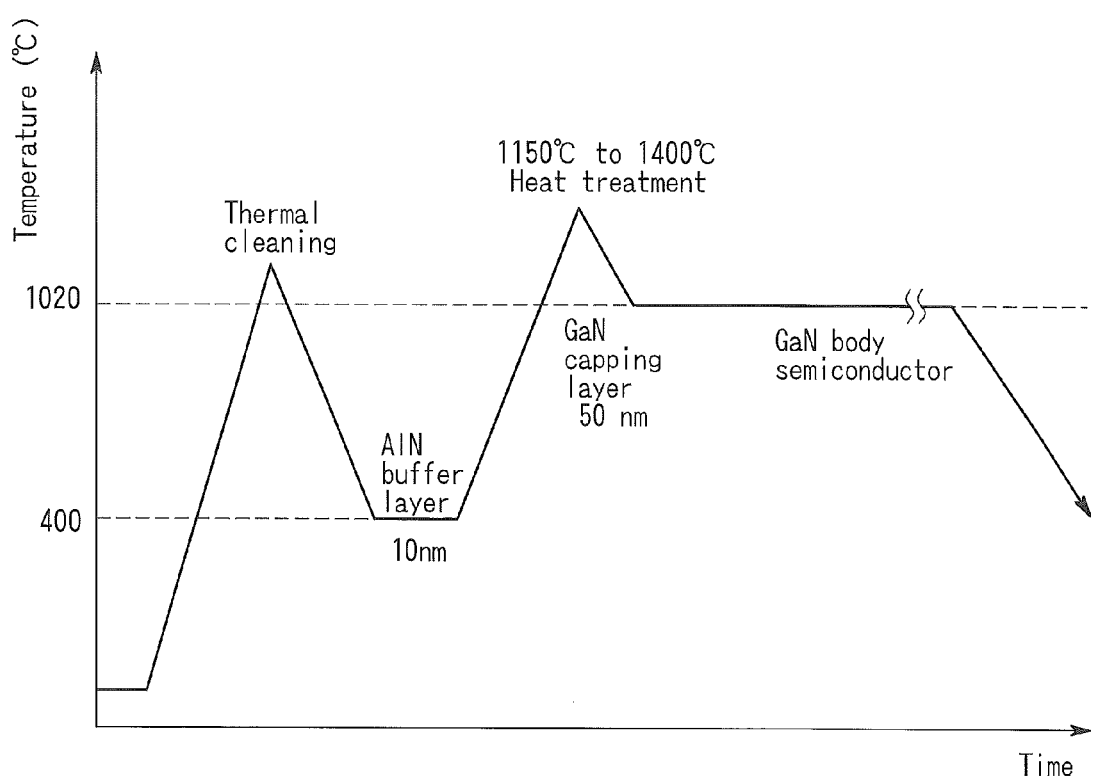
FIG. 5 is a temperature change characteristic diagram in the comparative example in which GaN was grown by heat-treating the buffer layer without forming a capping layer.

Next will be described, as a comparative example, the result of the experiment in which the buffer layer was heat-treated without forming a capping layer on the buffer layer. The temperature change characteristics of the substrate are as shown in FIG. 5. In comparison with the characteristics shown in FIG. 1, the difference is only in that the buffer layer was heat-treated without forming a GaN capping layer, with the temperature of the AlN buffer layer elevated to any heat treatment temperature in a range from 1,150° C. to 1,400° C. under a stream of hydrogen gas and ammonia gas, and maintained for 10 seconds with keeping the gas flow rate.

Figure 8:
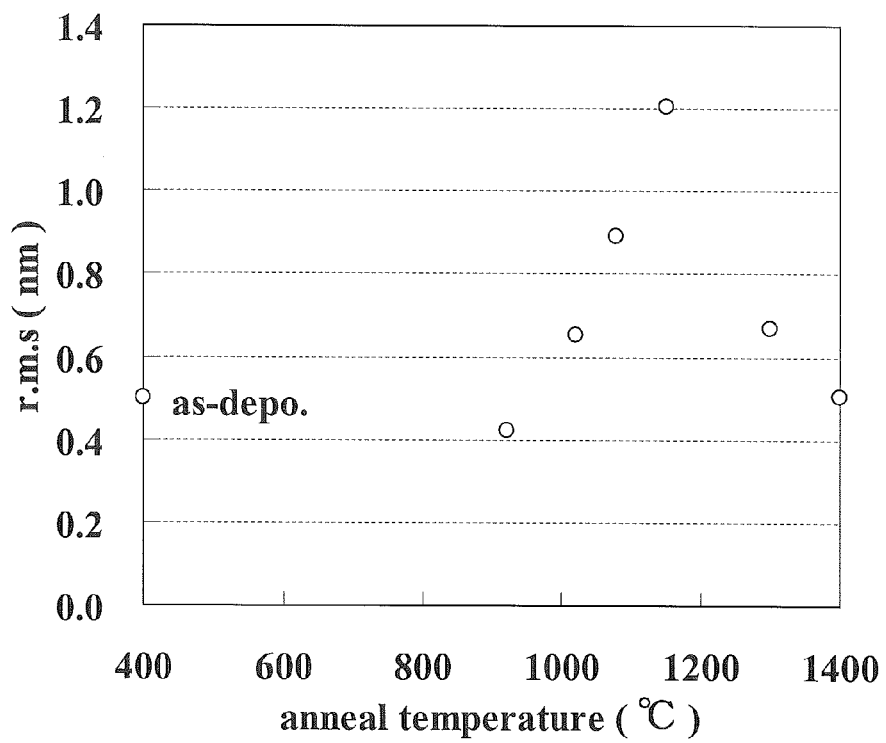
FIG. 8 is a characteristic diagram showing the relationship between the surface roughness of the buffer layer and the heat treatment temperature in the comparative example.
Figure 9:
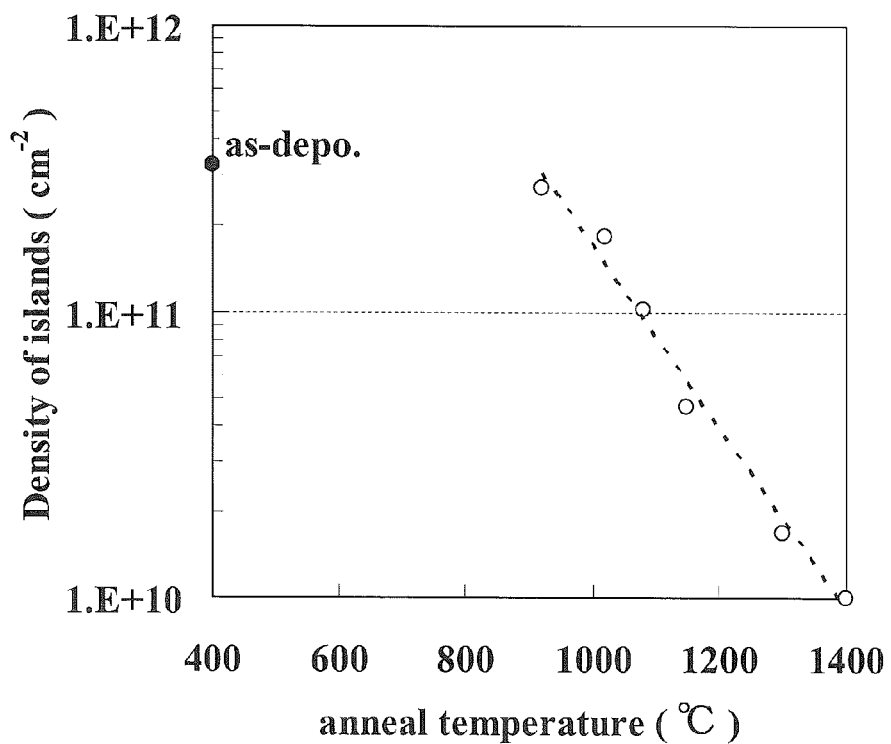
FIG. 9 is a characteristic diagram showing the relationship between the heat treatment temperature and the crystal nucleus density of the buffer layer in the comparative example.

Various samples were produced by changing the heat treatment temperature of the buffer layer to 400° C., 920° C., 1,020° C., 1,080° C., 1,150° C., 1,300° C., and 1,400° C. AFM image of the surface of the buffer layer after the heat treatment was measured. The relationship between the surface roughness of the buffer layer and the heat treatment temperature was measured from the AFM image. The results are shown in FIG. 8. Moreover, the relationship between the crystal nucleus (islands) density of the buffer layer and the heat treatment temperature was measured. The results are shown in FIG. 9. The surface roughness is defined as root-mean-square (RMS) of the deviations between height of convex portions or depth of concave portions and the average value thereof. As is clear from FIG. 8, when the heat treatment temperature falls within a range of 400° C. to 1,300° C., the surface roughness is increased as the temperature increases. This is because small nuclei are combined into a larger nucleus, resulting in increase of convex height (concave depth). On the other hand, when the heat treatment temperature is 1,300° C. or higher, the surface roughness of the buffer layer is reduced to 0.68 nm or less which is close to the surface roughness (0.5 nm) when the buffer layer was formed. This is probably because the nucleus further grows in this temperature zone, and mass transfer of atoms occurs due to high temperature, resulting in decrease of convex height (concave depth). As is clear from FIG. 9, it is further found that the crystal nucleus(islands) density is decreased in an exponential function as the heat treatment temperature increases. When the heat treatment temperature is 1,300° C. or higher, the crystal nucleus density is reduced to 1.7×10¹⁰/cm² or less. Moreover, when the heat treatment temperature is 1,150° C. or higher, the crystal nucleus density is reduced to 4.4×10¹⁰/cm² or less. Furthermore, the AFM image shows that respective crystal nucleus becomes large as the heat treatment temperature increases, resulting in reduction in the crystal nucleus density. Particularly, as compared with the case when the buffer layer was formed at 400° C., in the case when the heat treatment is 1,300° C. or 1,400° C., the crystal nucleus remarkably becomes large, and the crystal nucleus density was remarkably reduced. From the above, it was found that the heat treatment is 1,150° C. or higher, preferably 1,250° C. or higher, and further preferably 1,300° C. or higher.

Figure 6:
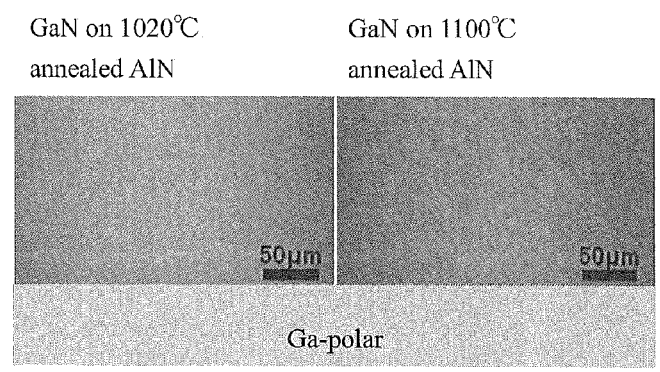
FIG. 6 is optical photomicrographs showing the surface condition of GaN in the comparative example in which GaN was grown by heat-treating the buffer layer without forming a capping layer.
Figure 7:
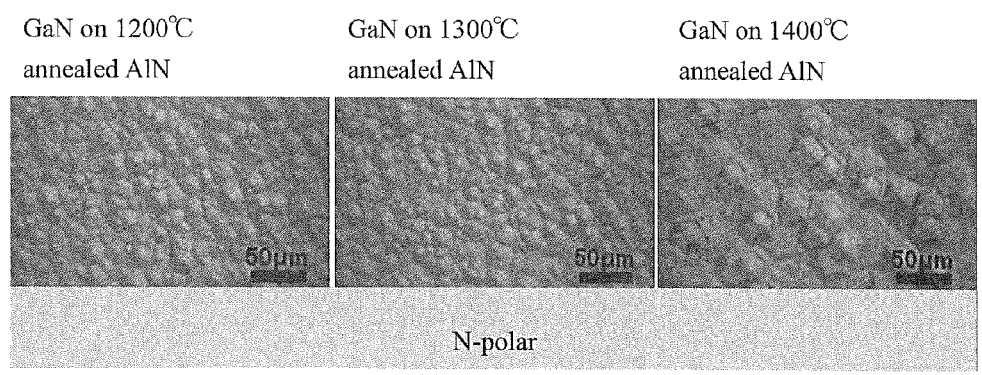
FIG. 7 is optical photomicrographs showing the surface condition of GaN in the comparative example in which GaN was grown by heat-treating the buffer layer without forming a capping layer.

Next, the relationship between the heat treatment temperature of the buffer layer not covered by a capping layer and the surface condition of GaN grown on the buffer layer was measured. FIGS. 6 and 7 are the optical photomicrographs showing the surface conditions of GaN. When the heat treatment temperature is 1,100° C. or less, the GaN surface is uniform and flat. When the heat treatment temperature is 1,200° C. or higher, the GaN surface is rough. At a temperature of 1,200° C. or higher, as the temperature increases, a crystal having a hexagonal pyramid or hexagonal prism shape is observed. It is found that the convex height (concave depth) is extremely large. The rough surface conditions of FIG. 7 show that the GaN surface is an N-polar surface. When the etching resistance was checked using KOH solution, GaN shown in FIG. 7 had almost no etching resistance, and the entire surface of GaN was etched. Since the buffer layer was not covered by the capping layer, Al as the element constituting the buffer layer was oxidized at a heat treatment temperature of 1,200° C. or higher, and the growth surface of GaN grown on the buffer layer was inverted to an N-polar surface.

On the other hand, when the heat treatment was performed after the buffer layer was covered by the capping layer, as is clear from the comparison between FIGS. 4 and 7, the GaN surface is flat, the growth surface of GaN is not an N-polar surface but an uniform Ga-polar surface. When GaN is grown after the process in which the capping layer is deposited on the buffer layer at a lower temperature than that at which Al of the buffer layer is oxidized, heat treatment is performed at 1,150° C. or higher, and the temperature is maintained at which a single crystal GaN grows, a GaN having reduced threading dislocation density and an uniform Ga-polar surface can be obtained.

In the above embodiment, the buffer layer was formed at 400° C., but the buffer layer may be formed in a temperature range from 300° C. to 600° C. because it is made in a polycrystal, amorphous or polycrystal/amorphous mixed state in the temperature range. The thickness of the buffer layer was 10 nm, but may fall within a range from 1 nm to 100 nm. In this thickness range, the buffer layer can be made in a polycrystal, amorphous or polycrystal/amorphous mixed state.

The present invention is not that the substrate temperature is increased from a low temperature at which the buffer layer is formed to a temperature of 1,020° C. at which a single crystal Group III nitride semiconductor to be grown on the buffer layer grows, and Group III nitride semiconductor is grown at that temperature. The present invention, as shown in FIG. 1, is that before growing a Group III nitride semiconductor, a capping layer is formed on the buffer layer at a lower temperature than that at which Al is oxidized, and the buffer layer covered by the capping layer is heat-treated at a higher substrate temperature than that at which a single crystal Group III nitride semiconductor can appropriately grow. Therefore, as compared with the case of immediately growing a Group III nitride semiconductor without forming a capping layer, the crystal nuclei of the buffer layer become large, and the crystal nucleus density is reduced. As a result, the density at the starting point of threading dislocation in the buffer layer is reduced, thereby the threading dislocation density of growing Group III nitride semiconductor can be reduced. Moreover, since the buffer layer is covered by the capping layer, Al of the buffer layer is not oxidized during heat treatment. Therefore, in the case of +c-plane growth, the polarity of Group III nitride semiconductor grown on the buffer layer is not inverted, and an uniform Ga-polar surface can be obtained. Even not in the case of +c-plane growth of body semiconductor, the formation of oxides of the elements constituting the buffer layer constituent element is inhibited, and a new threading dislocation starting at the oxide is prevented in the body semiconductor. Thus, the threading dislocation density of the semiconductor to be grown can be reduced by setting the heat treatment temperature of the buffer layer to a higher temperature than that at which a single crystal Group III nitride semiconductor to be grown on the buffer layer grows, that is, a temperature at which the semiconductor is difficult to grow. From this point of view, the heat treatment temperature is preferably from 1,150° C. to 1,700° C., from 1,300° C. to 1,700° C., from 1,300° C. to 1,500° C., from 1,200° C. to 1600° C., or from 1,200° C. to 1,400° C. Moreover, the heat treatment temperature is most preferably from 1,150° C. to 1,400° C. The heat treatment holding time is ten seconds, but may be one second. The heat treatment holding time is preferably one second to ten hours.

The buffer layer may be formed of $Al_xGa_{1-x}N$ (0<x<1), and $Al_xIn_yGa_{1-x-y}N$ (0<x<1, 0≤y<1, 0<x+y≤1) containing Al as an essential element in place of AlN. When the Group III nitride semiconductor to be grown on the buffer layer is $Al_zGa_{1-z}N$ (0<z<1), in terms of lattice matching, the buffer layer is preferably $Al_xGa_{1-x}N$ (0<x<1). The growth temperature of a single crystal of the target body semiconductor $Al_zGa_{1-z}N$ (0<z<1) is 1,000° C. or more and lower than the heat treatment temperature of the buffer layer (e.g. 1,300° C.). The internal pressure of a MOCVD chamber is preferably lower than 100 kPa (normal pressure). The internal pressure is 50 kPa or less, preferably 35 kPa or less, and more preferably 20 kPa or less. Since organic metal gas containing Al has high reactivity, reaction occurs before the raw material gases reach the substrate, and a bonded product that does not contribute to crystal growth of the target semiconductor is formed. Therefore, the pressure is preferably low. When the pressure is reduced and the flow rate of raw material gases is increased, a reaction before reaching the substrate is suppressed, and thereby high-efficient single crystal growth can be achieved on the substrate.

Moreover, the buffer layer may be formed by sputtering. At this time, the substrate temperature is preferably from 300° C. to 600° C. The buffer layer may be formed by Molecular Beam Epitaxy (MBE) or Pulse Laser Deposition (PLD).

The capping layer is formed at a lower temperature than that at which Al of the buffer layer is oxidized. In the case of an oxide substrate such as sapphire, when the temperature is increased, oxygen is evaporated from the rear or side surfaces of the substrate into the growth chamber. Since this oxygen oxidizes the buffer layer, the capping layer is also preferably formed at a lower temperature than that at which oxygen is evaporated from the substrate.

The above Embodiment described the case where the body semiconductor is grown with +c plane (Ga-polar surface) as a crystal growth surface. On the sapphire substrate having a c-plane or a-plane as a crystal growth surface, a Group III nitride semiconductor having a +c-plane as a growth surface grows. However, as mentioned above, when an oxide of the element constituting the buffer layer is formed, a new crystal defect occurs. Therefore, it is effective to prevent oxidization of the buffer layer by the capping layer. It is also effective to grow the body semiconductor in a direction other than the +c axis direction where the polarity is not inverted or polarity inversion does not cause a problem. A sapphire substrate having a r-plane or m-plane main surface may be used as a growth substrate. On the sapphire substrate having a r-plane or m-plane, a non-polar a-plane or non-polar m-plane Group III nitride semiconductor grows. In this case, the polarity is not inverted and polarity inversion does not cause a problem, but the presence of the capping layer can certainly reduce the threading dislocation density.

Figure 10:
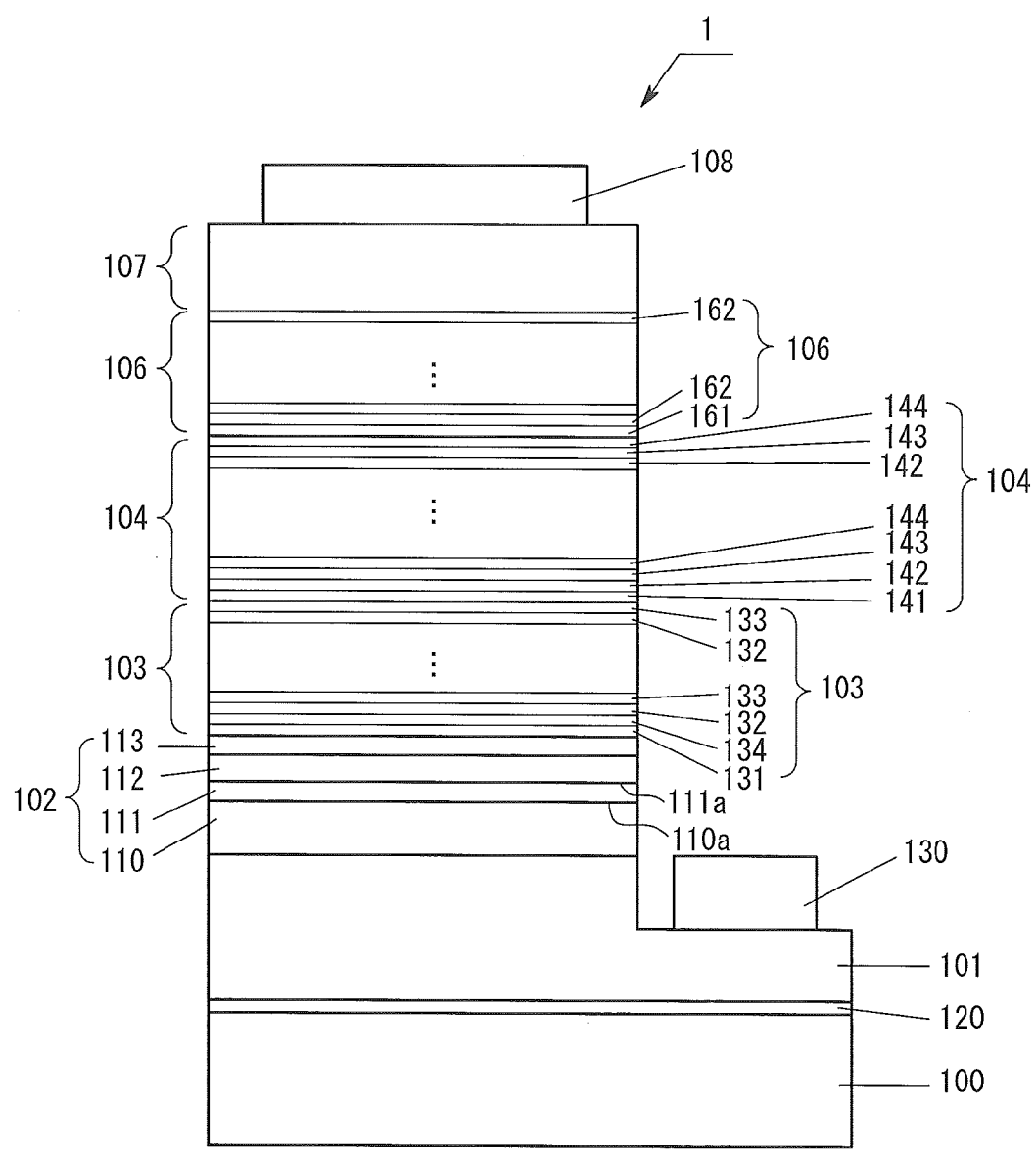
FIG. 10 is a structural drawing showing a light-emitting device produced by the production method according to the Embodiment of the present invention.

A light-emitting device produced by the method of the present invention will next be described. FIG. 10 shows the structure of a light-emitting device 1 produced by the production method of the present invention. The light-emitting device 1 has a structure in which an n-type contact layer 101, an ESD layer (electrostatic breakdown improving layer) 102, an n-layer side cladding layer (hereinafter referred to as an "n-type cladding layer") 103, a light-emitting layer 104, a p-layer side cladding layer (hereinafter referred to as a "p-type cladding layer") 106, and a p-type contact layer 107 are deposited, each of the layers being formed of Group III nitride semiconductor, on a sapphire substrate 100 via an AlN buffer layer 120 (a capping layer was omitted in FIG. 10 because the capping layer may be left thin or may not be left on the buffer layer); a p-electrode 108 is formed on the p-type contact layer 107; and an n-electrode 130 is formed on a portion of the n-type contact layer 101 exposed by etching from the p-type contact layer 107.

The n-type contact layer 101 is n-GaN having an Si concentration of $1 \times 10^{18}/cm^3$ or more. The n-type contact layer 101 has a threading dislocation density of $5 \times 10^8/cm^2$ or less at a thickness of 1 µm or more. To achieve good contact with the n-electrode 130, the n-type contact layer 101 may comprise a plurality of layers having different carrier concentrations.

The ESD layer 102 has a four-layer structure in which a first ESD layer 110, a second ESD layer 111, a third ESD layer 112, and fourth ESD layer 113 are deposited in this order on the n-type contact layer 101. The first ESD layer 110 is n-GaN having a Si concentration of $1 \times 10^{16}/cm^3$ to $5 \times 10^{17}/cm^3$. The first ESD layer 110 has a thickness of 200 nm to 1,000 nm.

The second ESD layer 111 is Si-doped GaN having a characteristic value, as defined by the product of Si concentration ($/cm^3$) and thickness (nm), of $0.9 \times 10^{20}$ to $3.6 \times 10^{20}$ ($nm/cm^3$). For example, when the second ESD layer 111 has a thickness of 30 nm, the Si concentration is $3.0 \times 10^{18}/cm^3$ to $1.2 \times 10^{19}/cm^3$.

The third ESD layer 112 is undoped GaN. The third ESD layer 112 has a thickness of 50 nm to 200 nm. The third ESD layer 112 is undoped, but has a carrier concentration of $1 \times 10^{16}/cm^3$ to $1 \times 10^{17}/cm^3$ due to residual carrier. The third ESD layer 112 may be doped with Si in a range that the carrier concentration is $5 \times 10^{17}/cm^3$ or less.

The fourth ESD layer 113 is Si-doped GaN having a characteristic value, as defined by the product of Si concentration ($/cm^3$) and thickness (nm), of $0.9 \times 10^{20}$ to $3.6 \times 10^{20}$ ($nm/cm^3$). For example, the fourth ESD layer 113 has a thickness of 30 nm, the Si concentration is $3.0 \times 10^{18}/cm^3$ to $1.2 \times 10^{19}/cm^3$.

The n-type cladding layer 103 has a superlattice structure including fifteen layer units, each including an undoped $In_{0.077}Ga_{0.923}N$ layer 131 (thickness: 4 nm), an undoped GaN layer 134 (thickness: 1 nm), an undoped $Al_{0.2}Ga_{0.8}N$ layer 132 (thickness: 0.8 nm), and a Si-doped n-GaN layer 133 (thickness: 1.6 nm), which are deposited in this order. However, the initial layer of the n-type cladding layer 103, which is in contact with the fourth ESD layer 113, is the $In_{0.077}Ga_{0.923}N$ layer 131, and the final layer of the n-type cladding layer 103, which is in contact with the light-emitting layer 104, is the n-GaN layer 133. The overall thickness of the n-type cladding layer 103 is 111 nm. The thickness of the $In_{0.077}Ga_{0.923}N$ layer 131 may be 1.5 nm to 5.0 nm. The thickness of the undoped GaN layer 134 may be 0.3 nm to 2.5 nm. The GaN layer 134 may be doped with Si. The thickness of the $Al_{0.2}Ga_{0.8}N$ layer 132 may be 0.3 nm to 2.5 nm. The thickness of the n-GaN layer 133 may be 0.3 nm to 2.5 nm.

The light-emitting layer 104 (also called an "active layer") has a MQW structure including eight layer units, each including an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm), which are deposited in this order. However, the initial layer of the light-emitting layer 104, which is in contact with the n-type cladding layer 103, is the $Al_{0.05}Ga_{0.95}N$ layer 141, and the final layer of the light-emitting layer 104, which is in contact with the p-type cladding layer 106 is the $Al_{0.2}Ga_{0.8}N$ layer 144. The overall thickness of the light-emitting layer 104 is 54.4 nm. All the layers of the light-emitting layer 104 are undoped.

The p-type cladding layer 106 has a structure including seven layer units, each including a p-$In_{0.05}Ga_{0.95}N$ layer 161 (thickness: 1.7 nm) and a p-$Al_{0.3}Ga_{0.7}N$ layer 162 (thickness: 3.0 nm), which are sequentially deposited. However, the initial layer of the p-type cladding layer 106, which is in contact with the light-emitting layer 104 is the p-$In_{0.05}Ga_{0.95}N$ layer 161, and the final layer of the p-type cladding layer 106, which is in contact with the p-type contact layer 107 is the p-$Al_{0.3}Ga_{0.7}N$ layer 162. The overall thickness of the p-type cladding layer 106 is 32.9 nm. Mg is employed as a p-type impurity.

The p-type contact layer 107 is formed of Mg-doped p-GaN. To achieve good contact with the p-electrode, the p-type contact layer 107 may comprise a plurality of layers having different carrier concentrations.

A method for producing the light-emitting device 1 will next be described with reference to FIG. 11. However, the periodic superlattice structure shown in FIG. 10 is omitted in FIG. 11.

The crystal growth method employed is Metal Organic Chemical Vapor Deposition (MOCVD). The gases employed for MOCVD are as follows: hydrogen ($H_2$) or nitrogen ($N_2$) as a carrier gas; ammonia gas ($NH_3$) as a nitrogen source; trimethylgallium ($Ga(CH_3)_3$, hereinafter may be referred to as "TMG") as a Ga source; trimethylindium ($In(CH_3)_3$, hereinafter may be referred to as "TMI") as an In source; trimethylaluminum ($Al(CH_3)_3$, hereinafter may be referred to as "TMA") as an Al source; silane ($SiH_4$) as an n-type dopant gas; and cyclopentadienylmagnesium ($Mg(C_5H_5)_2$, hereinafter may be referred to as "$Cp_2Mg$") as a p-type dopant gas.

Figure 11A:
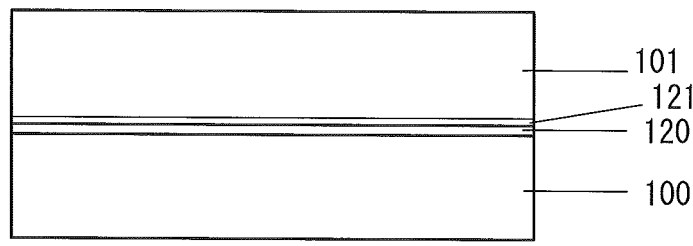
FIGS. 11A to 11C are cross-sectional views of the device showing the production processes of the light-emitting device.

Firstly, a sapphire substrate 100 was heated at 1,180° C. in a hydrogen atmosphere for cleaning, to thereby remove deposits from the surface of the sapphire substrate 100. Thereafter, an AlN buffer layer 120 was formed through MOCVD so as to have a thickness of 10 nm on the sapphire substrate 100 under a stream of TMA and ammonia gas together with a carrier gas while the substrate temperature was maintained at 400° C. Subsequently, the supply of TMA was stopped, the substrate temperature was increased to 1,020° C. under a stream of TMG, ammonia gas and hydrogen gas (carrier gas), and a GaN capping layer 121 was formed so as to have a thickness of 50 nm with holding the temperature and the gas flow rate for two minutes. Subsequently, the supply of TMG was stopped, the substrate temperature was increased to 1,300° C. under a stream of ammonia gas and hydrogen gas (carrier gas), and a buffer layer was heat-treated with holding the temperature and the gas flow rate for two minutes. Immediately after the substrate temperature was decreased to 1,020° C., an n-type contact layer 101 (body semiconductor) of GaN having a Si concentration of $4.5 \times 10^{18}/cm^{-3}$ was deposited on the buffer layer 120 covered by the capping layer 121, using TMG and ammonia gas as raw material gases, and silane gas as an impurity gas (FIG. 11A). Here TMG and silane gas were supplied when the substrate temperature reached 1,020° C. The n-type contact layer 101 has a threading dislocation density of $5\times10^8/\text{cm}^2$ or less at a thickness of 1 μm or more.

Subsequently, an ESD layer 102 was formed through the following processes. Firstly, a first ESD layer 110 formed of undoped n-GaN having a thickness of 200 nm to 1,000 nm, and a Si concentration of $1\times10^{16}/\text{cm}^3$ to $5\times10^{17}/\text{cm}^3$ was formed on the n-type contact layer 101 by MOCVD. The growth temperature was adjusted to 900° C. or more so as to obtain good quality crystal having low pit density. When the growth temperature is 1,000° C. or more, better quality crystal is obtained, which is preferable.

Next, a second ESD layer 111 of n-GaN doped with Si and having a characteristic value, as defined by the product of Si concentration (/cm³) and thickness (nm), of $0.9\times10^{20}$ to $3.6\times10^{20}$ (nm/cm³) was formed on the first ESD layer 110 by MOCVD. The growth temperature was adjusted to 800° C. to 950° C. Then, a third ESD layer 112 of undoped GaN having a thickness of 50 nm to 200 nm was formed on the second ESD layer 111 by MOCVD. The growth temperature was adjusted to 800° C. to 950° C. so as to obtain crystal having a carrier concentration of $5\times10^{17}/\text{cm}^3$ or less.

Figure 11B:
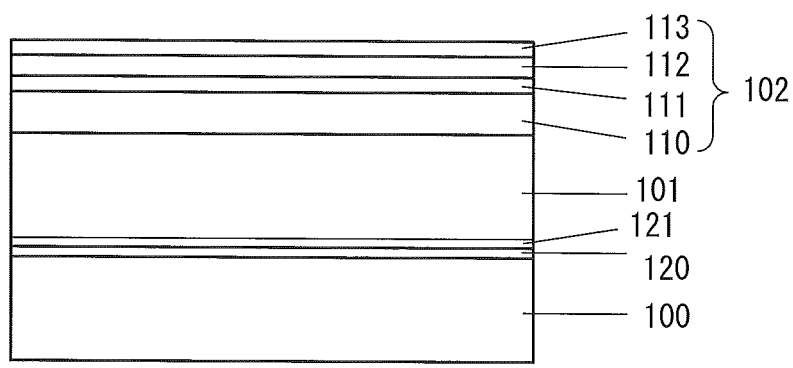
Figure 11C:
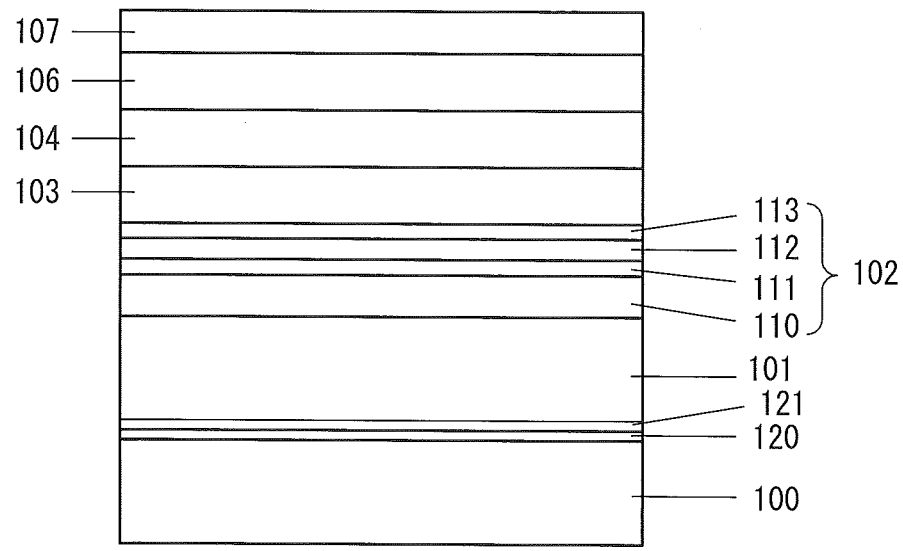

Subsequently, a fourth ESD layer 113 of n-GaN having a characteristic value, as defined by the product of Si concentration (/cm³) and thickness (nm), of $0.9\times10^{20}$ to $3.6\times10^{20}$ (nm/cm³) was formed on the third ESD layer 112 by MOCVD. The growth temperature was adjusted to 800° C. to 950° C. Through the above processes, the ESD layer 102 was formed on the n-type contact layer 101 (FIG. 11B).

Next, an n-type cladding layer 103 was formed on the ESD layer 102 by MOCVD. The n-type cladding layer 103 was formed by periodically depositing fifteen layer units, each including an undoped $\text{In}_{0.077}\text{Ga}_{0.923}\text{N}$ layer 131 (thickness: 4 nm), an undoped $\text{Al}_{0.2}\text{Ga}_{0.8}\text{N}$ layer 132 (thickness: 0.8 nm), and a Si-doped n-GaN layer 133 (thickness: 1.6 nm). The $\text{In}_{0.077}\text{Ga}_{0.923}\text{N}$ layer 131 was formed at a substrate temperature of 830° C. under a stream of silane gas, TMG, TMI, and ammonia gas. The undoped GaN layer 134 was formed at a substrate temperature of 830° C. under a stream of TMG and ammonia gas. The $\text{Al}_{0.2}\text{Ga}_{0.8}\text{N}$ layer 132 was formed at a substrate temperature of 830° C. under a stream of TMA, TMG, and ammonia gas. The n-GaN layer 133 was formed at a substrate temperature of 830° C. under a stream of TMG and ammonia gas.

Subsequently, a light-emitting layer 104 was formed on the n-type cladding layer 103. The light-emitting layer 104 was formed by periodically depositing eight layer units, each including the following four layers: an $\text{Al}_{0.05}\text{Ga}_{0.95}\text{N}$ layer 141, an $\text{In}_{0.2}\text{Ga}_{0.8}\text{N}$ layer 142, a GaN layer 143, and an $\text{Al}_{0.2}\text{Ga}_{0.8}\text{N}$ layer 144. The growth temperature of the $\text{Al}_{0.05}\text{Ga}_{0.95}\text{N}$ layer 141 was adjusted to any temperature from 800° C. to 950° C. The growth temperature of the $\text{In}_{0.2}\text{Ga}_{0.8}\text{N}$ layer 142, the GaN layer 143, and the $\text{Al}_{0.2}\text{Ga}_{0.8}\text{N}$ layer 144 was adjusted to 770° C. Alternatively the substrate temperature for growing each layer may be commonly adjusted to 770° C. Each of the layers 141 to 144 was grown under a stream of the corresponding raw material gases to form the light-emitting layer 104.

Next, a p-type cladding layer 106 was formed on the light-emitting layer 104. A p-$\text{In}_{0.05}\text{Ga}_{0.95}\text{N}$ layer 161 was formed so as to have a thickness of 1.7 nm at a substrate temperature of 855° C. under a stream of $\text{CP}_2\text{Mg}$, TMI, TMG, and ammonia gas, and a p-$\text{Al}_{0.3}\text{Ga}_{0.7}\text{N}$ layer 162 was formed so as to have a thickness of 3.0 nm at a substrate temperature of 855° C. under a stream of $\text{CP}_2\text{Mg}$, TMA, TMG, and ammonia gas. This layer formation process was repeated seven times to deposit the layers.

Then, a p-type contact layer 107 of p-type GaN doped with Mg at a concentration of $1\times10^{20}$ cm$^{-3}$ was formed so as to have a thickness of 50 nm at a substrate temperature of 1,000° C. by using TMG, ammonia gas, and $\text{CP}_2\text{Mg}$. Thus, the device structure shown in FIG. 11C was formed. The p-type contact layer 107 may have an Mg concentration of $1\times10^{19}$ cm$^{-3}$ to $1\times10^{21}$ cm$^{-3}$. The p-type contact layer 107 may have a thickness of 10 nm to 100 nm.

After Mg was activated by heat treatment, dry etching was performed from the top surface of the p-type contact layer 107, to thereby form a groove reaching the n-type contact layer 101. A p-electrode 108 comprising Rh/Ti/Au (which were deposited in this order on the p-type contact layer 107) was formed on the top surface of the p-type contact layer 107. Then, an n-electrode 130 comprising V/Al/Ti/Ni/Ti/Au (which were deposited in this order on the n-type contact layer 101) was formed on the n-type contact layer 101 exposed at the bottom of the groove by dry etching. Thus, the light-emitting device 1 shown in FIG. 10 was produced.

The present invention can be employed in a method for producing a Group III nitride semiconductor light-emitting device.

What is claimed is:

1. A method for growing Group III nitride semiconductor on a substrate comprising a material different from Group III nitride semiconductor, the method comprising:
    forming a buffer layer comprising at least one selected from a group consisting of AlN and $\text{Al}_x\text{In}_y\text{Ga}_{1-x-y}\text{N}$ (0<x<1, 0≤y<1, 0<x+y≤1) containing Al as an essential element, in a polycrystal, amorphous or polycrystal/amorphous mixed state, on the substrate;
    forming a capping layer comprising at least one selected from a group consisting of GaN, $\text{In}_u\text{Ga}_{1-u}\text{N}$ (0<u≤1), and $\text{Al}_v\text{In}_w\text{Ga}_{1-v-w}\text{N}$ (0<v<1, 0≤w<1, 0<v+w≤1) having an Al composition ratio lower than ½ of that of the buffer layer on and directly contacted with the buffer layer at a temperature lower than a temperature at which an oxide of element constituting the buffer layer is formed;
    performing heat treatment of the substrate having the buffer layer covered by the capping layer at a heat treatment temperature which is higher than a temperature at which a crystal of body semiconductor comprising Group III nitride semiconductor grows, without exposing the surface of the buffer layer; and
    after the heat treatment, lowering a substrate temperature to a temperature at which a crystal of the body semiconductor grows, and growing the body semiconductor on the buffer layer covered by the capping layer or the exposed buffer layer.

2. The method for growing the Group III nitride semiconductor according to claim 1, wherein an oxide of the element constituting the buffer layer comprises Al oxide.

3. The method for growing the Group III nitride semiconductor according to claim 1, wherein the heat treatment includes a process to reduce a crystal nucleus density of the buffer layer compared to that before the heat treatment.

4. The method for growing the Group III nitride semiconductor according to claim 2, wherein the heat treatment includes a process to reduce a crystal nucleus density of the buffer layer compared to that before the heat treatment.

5. The method for growing the Group III nitride semiconductor according to claim 1, wherein the capping layer has a thickness so as not to completely evaporate during the heat treatment and not to expose the buffer layer.

6. The method for growing the Group III nitride semiconductor according to claim 2, wherein the capping layer has a thickness so as not to completely evaporate during the heat treatment and not to expose the buffer layer.

7. The method for growing the Group III nitride semiconductor according to claim 1, wherein the capping layer is formed at a temperature lower than a temperature at which the capping layer is decomposed.

8. The method for growing the Group III nitride semiconductor according to claim 1, wherein the substrate comprises an oxide, and the capping layer is formed at a temperature lower than a temperature at which oxygen is released from the oxide.

9. The method for growing the Group III nitride semiconductor according to claim 1, wherein the capping layer is formed at a temperature not higher than a temperature at which a crystal of the body semiconductor grows.

10. The method for growing the Group III nitride semiconductor according to claim 1, wherein the heat treatment temperature is equal to or higher than a temperature at which the capping layer or the body semiconductor does not grow, a decomposition temperature or a sublimation temperature of the capping layer.

11. The method for growing the Group III nitride semiconductor according to claim 1, wherein the heat treatment temperature is 1,150° C. or more.

12. The method for growing the Group III nitride semiconductor according to claim 5, wherein the heat treatment temperature is 1,150° C. or more.

13. The method for growing the Group III nitride semiconductor according to claim 1, wherein the heat treatment is performed in an atmosphere of gas including ammonia gas or nitride compound gas.

14. The method for growing the Group III nitride semiconductor according to claim 1, wherein the buffer layer is formed by MOCVD at a substrate temperature in a range of 300° C. to 600° C.

15. The method for growing the Group III nitride semiconductor according to claim 1, wherein the buffer layer is formed by sputtering, molecular beam epitaxy, or pulse laser deposition.

16. The method for growing the Group III nitride semiconductor according to claim 1, wherein the capping layer has a thickness of 1 nm to 500 nm.

17. The method for growing the Group III nitride semiconductor according to claim 12, wherein the capping layer has a thickness of 1 nm to 500 nm.

18. The method for growing the Group III nitride semiconductor according to claim 1, wherein the buffer layer comprises AlN, and the capping layer comprises GaN.

19. The method for growing the Group III nitride semiconductor according to claim 17, wherein the buffer layer has a thickness of 1 nm to 100 nm.

20. The method for growing the Group III nitride semiconductor according to of claim 19, wherein the body semiconductor comprises GaN.

* * * * *